US012425128B2

(12) United States Patent
Doherty et al.

(10) Patent No.: US 12,425,128 B2
(45) Date of Patent: Sep. 23, 2025

(54) HIGH-IMMUNITY WIRELESS COMMUNICATION FOR BATTERY MANAGEMENT SYSTEMS

(71) Applicant: Analog Devices International Unlimited Company, Limerick (IE)

(72) Inventors: Lance Doherty, Somerville, MA (US); Mark Alan Lemkin, Berkeley, CA (US); Thor Nelson Juneau, Los Gatos, CA (US); Gary Wayne Ng, Campbell, CA (US); Cornelius O'Mahony, Limerick (IE); Khaled Hassan, Cork (IE); Justine Mary McCormack, Kinsale (IE); Philip Eugene Quinlan, Glounthaune (IE)

(73) Assignee: Analog Devices International Unlimited Company, Limerick (IE)

( * ) Notice: Subject to any disclaimer, the term of this patent is extended or adjusted under 35 U.S.C. 154(b) by 140 days.

(21) Appl. No.: 18/466,707

(22) Filed: Sep. 13, 2023

(65) Prior Publication Data

US 2025/0088306 A1  Mar. 13, 2025

(51) Int. Cl.
*H04L 1/00* (2006.01)
*G01R 31/396* (2019.01)
(Continued)

(52) U.S. Cl.
CPC .......... *H04L 1/0015* (2013.01); *G01R 31/396* (2019.01); *H04L 1/0007* (2013.01);
(Continued)

(58) Field of Classification Search
CPC ..... H04L 1/0015; H04L 1/0007; H04L 1/003; G01R 31/396; B60L 58/18; B60L 58/12; B60L 58/16; B60L 2260/42
(Continued)

(56) References Cited

U.S. PATENT DOCUMENTS 4,979,183 A * 12/1990 Cowart .............. H04B 1/70755
375/E1.004
5,375,140 A * 12/1994 Bustamante ........... H04B 7/216
370/335

(Continued)

FOREIGN PATENT DOCUMENTS

CN  119628785 A  3/2025

OTHER PUBLICATIONS

"European Application Serial No. 24196101.0, Extended European Search Report mailed Jan. 23, 2025", 12 pgs.

(Continued)

*Primary Examiner* — Kerri L McNally
(74) *Attorney, Agent, or Firm* — Schwegman Lundberg & Woessner, P.A.

(57) ABSTRACT

Techniques to improve the immunity of wireless battery systems by transmitting heavily-coded signals, e.g., using multiple chips of a sequence for each bit of information, to trade data rate for interference or jamming immunity as a response once a noisy environment is identified. The techniques provide the system with a noise immunity operating mode (or high-immunity transmit and receive mode) that can improve resilience to interference or jamming by reducing the data rate. One option for reducing the data rate is by slowing down the transmission bit rate to reduce the occupied transmit bandwidth to minimize the probability of collisions with interfering signals. Another option is though digital coding methods using Forward Error Correction such as Convolutional Coding, Reed-Solomon Coding and Turbo coding. A third option is with RF spread spectrum techniques such as Direct Sequence Spread Spectrum (DSSS) or Frequency Hopped Spread Spectrum (FHSS).

20 Claims, 2 Drawing Sheets

(51) Int. Cl.
*B60L 58/12* (2019.01)
*B60L 58/16* (2019.01)
*B60L 58/18* (2019.01)

(52) U.S. Cl.
CPC ............... *H04L 1/003* (2013.01); *B60L 58/12* (2019.02); *B60L 58/16* (2019.02); *B60L 58/18* (2019.02); *B60L 2260/42* (2013.01)

(58) Field of Classification Search
USPC ....................................................... 340/636.1
See application file for complete search history.

(56) References Cited

U.S. PATENT DOCUMENTS

| | | | | |
|---|---|---|---|---|
| 5,488,631 A | * | 1/1996 | Gold | .................. H04B 7/2618 380/34 |
| 5,555,268 A | * | 9/1996 | Fattouche | ........... H04J 13/0077 375/147 |
| 5,943,322 A | * | 8/1999 | Mayor | ................. H04B 7/2628 370/348 |
| 8,358,613 B1 | * | 1/2013 | Giallorenzi | ........... H04W 12/02 370/328 |
| 2010/0167771 A1 | * | 7/2010 | Raghothaman | ..... H04W 52/244 455/500 |
| 2017/0126271 A1 | * | 5/2017 | MacLean | .......... H04L 25/03834 |
| 2018/0367192 A1 | * | 12/2018 | O'Shea | ................ H04B 7/0452 |
| 2021/0376877 A1 | | 12/2021 | Wolokita et al. | |

OTHER PUBLICATIONS

Bansal, Pallavi, et al., "Wireless Battery Management System for Electric Vehicles", IEEE Transportation Electrification Conference (ITEC-INDIA), (Dec. 17, 2019), 1-5.

Sheikh, Muhammad Usman, et al., "Adaptive Physical Layer Selection for Bluetooth 5: Measurements and Simulations", Wireless Communications and Mobile Computing, (Jan. 6, 2021), 1-10.

* cited by examiner

HIGH-IMMUNITY WIRELESS COMMUNICATION FOR BATTERY MANAGEMENT SYSTEMS

FIELD OF THE DISCLOSURE

This document pertains generally, but not by way of limitation, to techniques for battery management techniques in electric vehicles.

BACKGROUND

Management of a battery system, such as included in an electric vehicle, is essential for ensuring long life, efficiency, and reliability of the battery system and the equipment powered by the battery system. Proper management requires that the battery system be permanently monitored, such as to provide real time knowledge of battery cell voltage.

Battery systems can be wired or wireless. A wireless battery system can be advantageous because the absence of physical wires eliminates the need for complex installation and maintenance, providing greater flexibility and cost savings to manufacturers, for example.

SUMMARY OF THE DISCLOSURE

This disclosure describes various techniques to improve the immunity of wireless battery systems by transmitting heavily-coded signals, e.g., using multiple chips of a sequence for each bit of information, to trade data rate for interference or jamming immunity as a response once a noisy environment is identified. The techniques described provide a system with a noise immunity operating mode (or high-immunity transmit and receive mode) that can improve resilience to interference or jamming by reducing the data rate.

In some aspects, this disclosure is directed to a system for wireless communication in an electric vehicle and having a normal operating mode and a noise immunity operating mode, the system comprising: a first wireless cell node in electrical communication with a first plurality of battery cells, the first wireless cell node including a first transceiver device; a battery management system controller subsystem including a network manager, wherein the network manager includes a second transceiver device configured to wirelessly communicate with the first transceiver device, wherein the first transceiver device and the second transceiver device are configured to switch from the normal operating mode to the noise immunity operating mode when a noisy environment is determined to be present, wherein the normal operating mode has a first lengthening factor with a first number of transmitted bits per bit of information, and wherein the noise immunity operating mode has a second lengthening factor with a second number of transmitted bits per bit of information that is greater than the first number of transmitted bits per bit of information.

In some aspects, this disclosure is directed to a method for wireless communication in an electric vehicle, the method comprising: electrically coupling a first wireless cell node with a first plurality of battery cells, the first wireless cell node including a first transceiver device; wirelessly communicating between the first transceiver device and a second transceiver device, wherein a battery management system controller subsystem includes a network manager, and wherein the network manager includes the second transceiver device; and determining that a noisy environment is present and, in response, switching the first transceiver device and the second transceiver device from a normal operating mode to a noise immunity operating mode, wherein the normal operating mode has a first lengthening factor with a first number of transmitted bits per bit of information, and wherein the noise immunity operating mode has a second lengthening factor with a second number of transmitted bits per bit of information that is greater than the first number of transmitted bits per bit of information.

In some aspects, this disclosure is directed to a system for wireless communication in an electric vehicle and having a normal operating mode and a noise immunity operating mode, the system comprising: a first wireless cell node electrically coupled with a first plurality of battery cells, the first wireless cell node including a first transceiver device; a battery management system controller subsystem including a network manager, wherein the network manager includes a second transceiver device; and means for determining that a noisy environment is present and, in response, switching the first transceiver device and the second transceiver device from a normal operating mode to a noise immunity operating mode, wherein the normal operating mode has a first lengthening factor with a first number of transmitted bits per bit of information, and wherein the noise immunity operating mode has a second lengthening factor with a second number of transmitted bits per bit of information that is greater than the first number of transmitted bits per bit of information.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A wireless battery system utilizes wireless communication techniques for wireless data transfer. Wireless data transfer relies on the transmission and reception of electromagnetic signals to establish communication between devices.

The present inventors have recognized that, in certain scenarios, these signals can be disrupted, such as by jamming or interference, which can lead to significant challenges in the transfer of wireless data. Jamming or interference refers to the intentional or unintentional interference with wireless signals, which can result from, among other things, the generation of noise, the transmission of other signals on the same frequency, or physical obstructions, such as lithium-ion battery cells and metal support structures, which weaken or block the signal path. The effects of jamming or interference can range from temporary interference to complete disruption of wireless data transfer, posing a safety concern in an electric vehicle.

This disclosure describes various techniques to improve the immunity of wireless battery systems, such as from interference or jamming attacks. As described in detail below, this disclosure describes transmitting heavily-coded signals, e.g., using multiple chips of a sequence for each bit of information, to trade data rate for interference or jamming immunity as a response once a noisy environment is identified. The techniques described in this disclosure provide the system 100 with a noise immunity operating mode (or high-immunity transmit and receive mode) that can improve resilience to interference or jamming by reducing the data rate. One option for reducing the data rate is by slowing down the transmission bit rate to reduce the occupied transmit bandwidth to minimize the probability of collisions with interfering signals. Another option is though digital coding methods using Forward Error Correction such as Convolutional Coding, Reed-Solomon Coding and Turbo coding. A third option is with RF spread spectrum techniques such as Direct Sequence Spread Spectrum (DSSS) or Frequency Hopped Spread Spectrum (FHSS).

Figure 1:
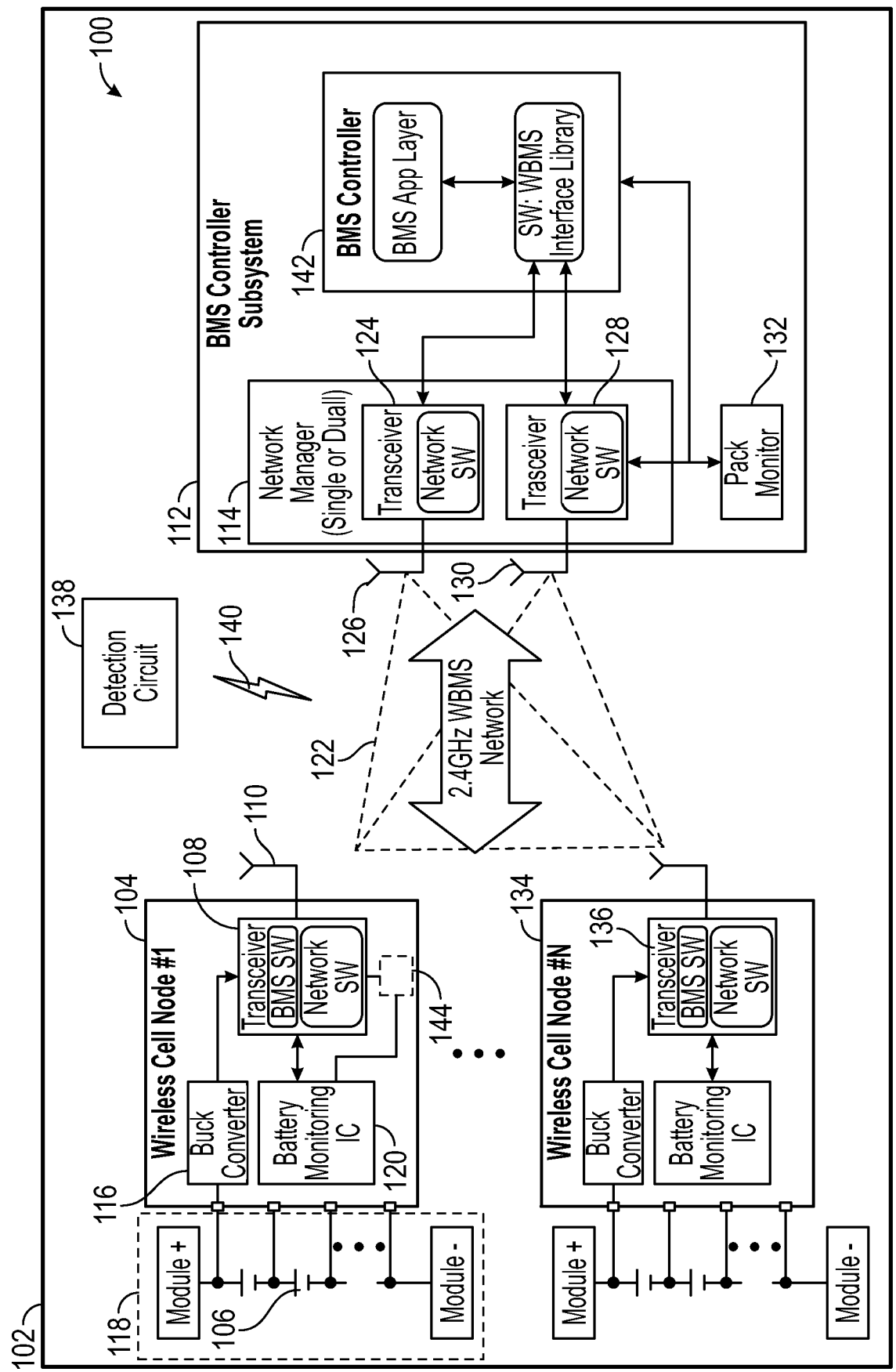
FIG. 1 is a block diagram of an example of a system for wireless communication in an electric vehicle, in accordance with this disclosure.

FIG. 1 is a block diagram of an example of a system 100 for wireless communication in an electric vehicle 102 in accordance with this disclosure. The system 100 includes a first wireless cell node 104 in electrical communication with a plurality of battery cells 106. The first wireless cell node 104 includes a wireless transceiver device 108 having an antenna 110 that can communicate with a battery management system controller subsystem 112 and, in particular, a network manager 114, over a wireless network, e.g., 2.4 Gigahertz.

The first wireless cell node 104 can include a buck converter 116 to step down the DC voltage of the battery module 118, which includes the plurality of battery cells 106, to provide power to the transceiver device 108. In addition, the first wireless cell node 104 includes a battery monitoring device 120 that is configured to receive and monitor battery cell voltages of the individual battery cells.

The battery monitoring device 120 is in electrical communication with the transceiver device 108. In some examples, the transceiver device 108 can transmit the battery data including cell voltage, temperature, diagnostic, and current data over the wireless network 122 to the battery management system controller subsystem 112, which can then analyze the data about the plurality of battery cells 106, such as by performing various calculations, to determine a state of charge and/or state of health of the battery cells and/or battery module.

In other examples, the first wireless cell node 104 can optionally include an edge processor 144 in electrical communication with the battery monitoring device 120 and the transceiver device 108. The edge processor 144 can compress the data about the plurality of battery cells 106, such as by performing various calculations, to determine a state of charge and/or state of health of the battery cells and/or battery module. The edge processor 144 can communicate the information to the transceiver device 108, which can then transmit the compressed data to the battery management system controller subsystem 112. Edge processing can reduce the computation burden on the battery management system controller subsystem 112. The battery management system controller subsystem 112 does not have to perform all of the checks, calculations, and the like. Instead, those checks, calculations, etc. can be performed by the cell node, such as the first wireless cell node 104, and a subset of the original measurement data is communicated over the wireless network 122.

The network manager 114 includes a transceiver device 124 configured to wirelessly communicate, via antenna 126, with the transceiver device 108 of the first wireless cell node 104. In some examples, the network manager 114 can include another transceiver device 128 configured to wirelessly communicate, via antenna 130, with the transceiver device 108 of the first wireless cell node 104. The network manager 114 can also be in electrical communication with a battery pack monitoring IC 132. The battery pack monitoring IC 132 provides continuous integration of voltage and current of the full series connections of cells comprising the battery pack to ensure lossless tracking of charge and energy delivered or received.

To monitor all of the battery cells in the electric vehicle, e.g., 200 battery cells connected in series, the system 100 can include N number of wireless cell nodes, where each of the cell nodes monitors some of the battery cells. The Nth wireless cell node 134 includes features similar to those of the first wireless cell node 104 and, for brevity, will not be described again. A transceiver device 136 of the Nth wireless cell node 134 is configured to wireless communicate with the first wireless cell node 104 and the battery management system controller subsystem 112.

Direct sequence spread spectrum (DSSS), for example, replaces each data bit with a multi-bit sequence to spread the RF energy over a much wider bandwidth. The number of chips per bit is known as a spreading rate. A signal is more immune to interference or jamming as the spreading rate and the Hamming distance increases. For example, if there is a spreading rate of 10, it means that there are 10 "chips" for each bit in the original signal. This high rate binary sequence (the chipping code) is used to encode the signal before it is transmitted, and it is used to decode the signal when it is received, thus recovering the original data. The encoding technique is used to improve the signal's resistance to noise and interference, as well as its security and privacy, since the signal appears as noise to receivers that do not know the chipping code.

Forward Error Correction (FEC) codes such as Reed-Solomon, Turbo, and Low Density Parity Check (LDPC) code, have a similar net effect to DSSS. In FEC coding, multiple bits are sent to encode a single bit of information. For example, a ½-rate Turbo code will send two bits for every one bit of encoded information. Similar to the spreading rate described for DSSS coding, FEC codes become more effective as the length of the wireless packet increases relative to the information encoded in the packet. To encompass the commonality between the DSSS and FEC approaches, this document will use the term "lengthening factor" to represent either the spreading rate or the coding factor.

Whether the signal uses DSSS or is encoded with FEC, it can be modulated using modulations such as GFSK, OQPSK, and BPSK at the transmitter and demodulated at the receiver.

In accordance with this disclosure, the system 100 has a normal operating mode and a noise immunity operating mode. To improve the immunity of the system 100, such as from interference or jamming attacks, the first transceiver device 108 and the second transceiver device 124 are configured to switch from a normal operating mode to a noise immunity operating mode when a noisy environment is determined to be present. The normal operating mode has a first lengthening factor with a first number of transmitted bits per bit of informational content, and the noise immunity operating mode has a second lengthening factor with a second number of transmitted bits per bit of informational content. that is greater than the first number of chips per bit. The increased lengthening factor in the noise immunity operating mode can improve the immunity of the system 100 to interference and jamming, such as by providing immunity against single bit errors.

In some examples, the second lengthening factor is equal to or greater than two times the first lengthening factor. In some examples, the first lengthening factor is 2 and the second lengthening factor is 20, which can provide a 10 dB improvement. In some examples, the first lengthening factor is 2 and the second lengthening factor is 1000, which can provide a 27 dB improvement.

The transceiver devices shown in FIG. 1 are configured to transmit during various timeslots. Using the techniques of this disclosure, in some examples, the transceiver device 108 of the first wireless cell node 104 is configured to transmit, during the normal operating mode, within a first timeslot having a first duration, and the transceiver device 108 is configured to transmit, during the noise immunity operating mode, within a second timeslot having a second duration. In some examples, the second timeslot includes a plurality of first timeslots.

In some examples, it can be desirable to extend the time each transaction takes such that the second duration of the noise immunity operating mode is greater than the first duration of the normal operating mode. By way of a non-limiting example, the first duration is equal to or greater than 1.5 milliseconds, and the second duration is equal to or greater than 70 milliseconds. In this manner, during periods of increased noise, the amount of time that the system 100 is allowed to communicate is increased, thereby improving the immunity to the noise. As an example, during the timeslots with extended duration, the system 100 can transmit less data, which can improve the likelihood that the transmitted data is received correctly. As another example, during the timeslots with extended duration, the same amount of data can be transmitted that would have been transmitted in a normal operating mode, which can also improve the likelihood that the transmitted data is received correctly.

In other examples, the second duration is the same length or duration as the first duration. For example, during the noise immunity operating mode, the first transceiver device 108 can transmit during the same timeslot duration only some of the data, e.g., "critical data", that would have been transmitted in the normal operating mode. The entirety of the data can be transmitted serially using additional timeslots.

The techniques described in this disclosure provide the system 100 with a noise immunity operating mode (or high-immunity transmit mode) that can improve resilience to interference or jamming by reducing the data rate, either though digital coding methods or by slowing down the transmission bit rate. The cell node can send similarly encoded data but less frequently at a slower speed. Or, the cell node can compress the full data down to a smaller summary so as to require less transmit time at a slower speed. In addition, the cell node can run a state estimator locally and extend a safety threshold timing at the battery management system controller subsystem 112.

As mentioned above, the first transceiver device 108 and the second transceiver device 124 are configured to switch from a normal operating mode to a noise immunity operating mode when a noisy environment is determined to be present. One or more of the first wireless cell node 104, the network manager 114, and the battery management system controller subsystem 112 is configured to determine that the noisy environment is present. For example, the system 100 includes a detection circuit 138, e.g., a wideband detector circuit, configured to measure the power level or strength of a signal across a broad frequency range. The detection circuit 138 can measure the power level or strength of a signal and transmit, via a signal 140 from a transceiver device, the measurements to one or more of the first wireless cell node 104, the network manager 114, and the battery management system controller subsystem 112, which can then determine whether a noisy environment is present and can also determine the frequency components of unwanted interference signals.

For example, one or more of the first wireless cell node 104, the network manager 114, and the battery management system controller subsystem 112 can determine that a noisy environment is present using one or more of a packet delivery ratio metric, an inter packet delay metric, a signal-to-noise metric, and a Received Signal Strength Indicator (RSSI) metric. In some examples, the cell node having the issues can make the determination. The transceiver devices of the corresponding wireless cell nodes can each include a microcontroller unit that can perform the calculations needed to determine that a noisy environment is present.

In other examples, the transceiver devices of the network manager 114 can each include a microcontroller unit that can perform the calculations needed to determine that a noisy environment is present. Similarly, the battery management system controller subsystem 112 can include a battery management system controller 142 that can perform the calculations needed to determine that a noisy environment is present.

In an example, the battery management system controller 142 can determine that a critical timeout is approaching, due to interference or jamming. In response, the battery management system controller 142 can communicate with the network manager 114 and the network manager 114 can switch to the noise immunity operating mode from the normal operating mode. The network manager 114 can transmit a broadcast to the network with the mode switch using a high-immunity transmission, where the transmission potentially extends beyond the timeslot allocated for the downstream link. In response, the cell nodes, such as the first wireless cell node 104, in the network switch to sending high-immunity transmissions at a reduced transmit schedule so there are no collisions.

In another example, a cell node, e.g., the first wireless cell node 104, can determine that it has not received acknowledgements to upstream data from the network manager 114. In response, the cell node can infer that a critical timeout is approaching. The cell node can use its next scheduled upstream to start transmitting at the regular time but extend transmission beyond the timeslot boundary.

In addition to the techniques described above, the system 100 can implement a partial switch mode when a noisy environment is present. In the partial switch mode, a network manager 114 having two transceiver devices can have a first one of the transceiver devices operate in a "slow" mode and a second one of the transceiver devices operate in a "fast" mode. For example, the transceiver device 124 of the network manager 114 can transmit, during the normal operating mode, within a first timeslot having the first duration and the transceiver device 128 can transmit, during the noise immunity operating mode, within a second timeslot having the second duration, where the second duration is longer than the first duration. By using these techniques, one transceiver device of the network manager 114 can stay on the original transmit schedule and handle any cell nodes that are able to communicate properly, and another transceiver device of the network manager 114 can switch to the new transmit schedule that is appropriate for noisy environments.

The system 100 can switch from the noise immunity operating mode back to the normal operating mode using one or more of the metrics that the system 100 used to switch into the noise immunity operating mode. For example, the detection circuit 138 can periodically transmit signal information to the transceiver device 108 of the first wireless cell node 104, and the transceiver device 108 can determine whether an interference signal strength, e.g., a background RSSI metric, is below a threshold. If the interference signal strength is below the threshold, the system 100 can switch from the noise immunity operating mode back to the normal operating mode. If the interference signal strength is not below the threshold, the system 100 can remain in the noise immunity operating mode and periodically recheck the interference signal strength.

In addition to the techniques above, one or more of the transceiver devices of the system 100 are configured to identify heavily-coded or uncoded transmissions in real-time and to decode, based on the identification, the transmissions, where transmissions sent using the normal operating mode have a different error coding than those sent using the noise immunity operating mode. These transceiver devices include the transceiver device 108 of the first wireless cell node 104, the transceiver device 136 of Nth wireless cell node 134, the transceiver device 124 of network manager 114, and the transceiver device 128 of network manager 114. As described above, this disclosure describes techniques to switch from a normal operating mode (short timeslots and low chips per bits) to a noise immunity operating mode (longer slots and higher chips per bits). The decision to switch operating modes is communicated from the decision-making entity (cell node, network manager, or controller) to the other devices in the network. Also, this transmission is desirably sent using the noise immunity operating mode (high chips per bit) to maximize the probability of reception in case of jamming or interference.

There are two techniques to send this transmission within the normal mode of operation as the network has not yet switched to the noise immunity operating mode. In the first technique, a dedicated timeslot can be used, where all transceiver devices are set to receive the transmission using the noise immunity operating mode configuration. However, this transmission can be sporadic and having a dedicated timeslot may not be the most efficient use of bandwidth.

In the second technique, any of the available timeslots can be used. In this case, the transceiver device can be configured to identify in real-time whether transmissions are heavily coded (high lengthening factor) or uncoded (low lengthening factor) based on the preamble length of the incoming packet. That is, the transceiver device can identify in real-time whether transmissions have the first lengthening factor with a first number of transmitted bits per bit of information (the normal operating mode) or have a second lengthening factor with a second number of transmitted bits per bit of information (the noise immunity operating mode). Then, the transceiver device can apply, based on the identification, a corresponding decoding technique and the like to the transmissions, where transmissions sent using the normal operating mode have a different error coding than those sent using the noise immunity operating mode.

Figure 2:
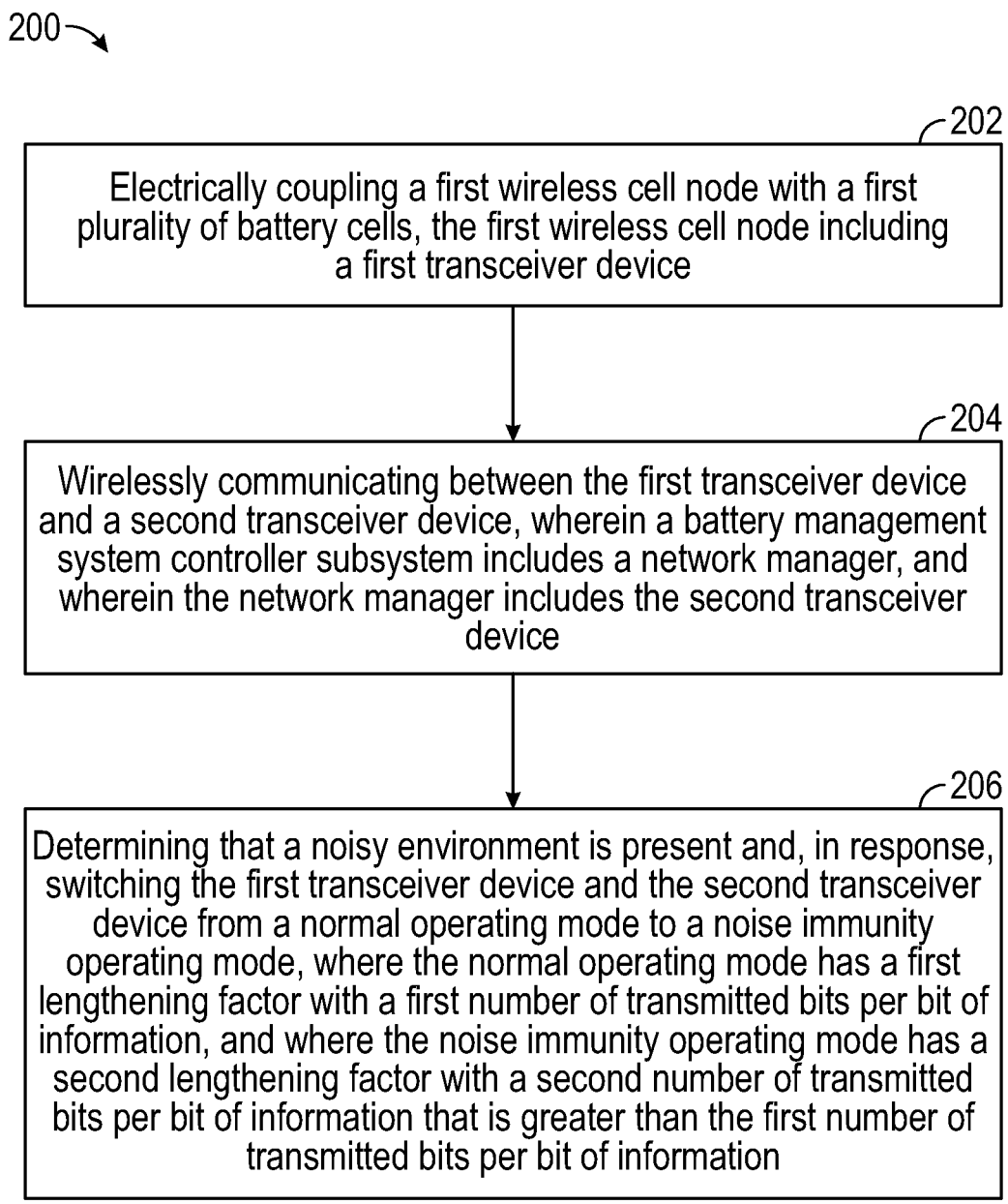
FIG. 2 is a flow diagram of an example of a method for wireless communication in an electric vehicle, in accordance with this disclosure.

FIG. 2 is a flow diagram of an example of a method 200 for wireless communication in an electric vehicle, in accordance with this disclosure. At block 202, the method 200 includes electrically coupling a first wireless cell node with a first plurality of battery cells, the first wireless cell node including a first transceiver device. For example, the first wireless cell node 104 (of FIG. 1) is electrically coupled with a first plurality of battery cells 106 and the first wireless cell node 104 includes a first transceiver device 108.

At block 204, the method 200 includes wirelessly communicating between the first transceiver device and a second transceiver device, where a battery management system controller subsystem includes a network manager, and where the network manager includes the second transceiver device. For example, the first wireless cell node 104 can wirelessly communicate with the second transceiver device 124 of the network manager 114, where the network manager 114 forms part of the battery management system controller subsystem 112.

At block 204, the method 200 includes determining that a noisy environment is present and, in response, switching the first transceiver device and the second transceiver device from a normal operating mode to a noise immunity operating mode, where the normal operating mode has a first lengthening factor, and where the noise immunity operating mode has a second lengthening factor greater than the first lengthening factor.

In some examples, the second lengthening factor is equal to or greater than 2 times the first lengthening factor.

In some examples, determining that a noisy environment is present uses one or more of a packet delivery ratio metric, an inter packet delay metric, a signal-to-noise metric, and a Received Signal Strength Indicator (RSSI) metric.

In some examples, the method 200 includes transmitting, during the normal operating mode, within a first timeslot having a first duration, and transmitting, during the noise immunity operating mode, within a second timeslot having a second duration. In some examples, the second duration is greater than the first duration.

In some examples, the method 200 further includes identifying that a transmission from the second transceiver device has the first lengthening factor or the second lengthening factor and decoding, based on the identification, the identified transmission.

VARIOUS NOTES

Each of the non-limiting claims or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more claims thereof), either with respect to a particular example (or one or more claims thereof), or with respect to other examples (or one or more claims thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more claims thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. A system for wireless communication in an electric vehicle and having a normal operating mode and a noise immunity operating mode, the system comprising:
a first wireless cell node in electrical communication with a first plurality of battery cells, the first wireless cell node including a first transceiver device;
a battery management system controller subsystem including a network manager, wherein the network manager includes a second transceiver device configured to wirelessly communicate with the first transceiver device,
wherein the first transceiver device and the second transceiver device are configured to switch from the normal operating mode to the noise immunity operating mode when a noisy environment is determined to be present,
wherein the normal operating mode has a first lengthening factor with a first number of transmitted bits per bit of information, and wherein the noise immunity operating mode has a second lengthening factor with a second number of transmitted bits per bit of information that is greater than the first number of transmitted bits per bit of information.

2. The system of claim 1, wherein the first transceiver device is configured to transmit, during the normal operating mode, within a first timeslot having a first duration, and wherein the first transceiver device is configured to transmit, during the noise immunity operating mode, within a second timeslot having a second duration.

3. The system of claim 2, wherein the network manager further includes a third transceiver device,
wherein the second transceiver device is configured to transmit, during the normal operating mode, within the first timeslot having the first duration, and
wherein the third transceiver device is configured to transmit, during the noise immunity operating mode, within the second timeslot having the second duration.

4. The system of claim 2, wherein the second duration is the same as the first duration.

5. The system of claim 2, wherein the second duration is greater than the first duration.

6. The system of claim 5, wherein the first duration is equal to or greater than 1.5 milliseconds, and wherein the second duration is equal to or greater than 70 milliseconds.

7. The system of claim 2, wherein the second lengthening factor is equal to or greater than 2 times the first lengthening factor.

8. The system of claim 1, wherein the first wireless cell node further includes a first processor configured to compress data about the first plurality of battery cells.

9. The system of claim 1, wherein the battery management system controller subsystem is configured to analyze data about the first plurality of battery cells.

10. The system of claim 1, wherein at least one of the first wireless cell node, the network manager, and the battery management system controller subsystem is configured to determine that the noisy environment is present.

11. The system of claim 10, wherein the at least one of the first wireless cell node and the battery management system controller subsystem is configured to determine that the noisy environment is present using one or more of a packet delivery ratio metric, an inter packet delay metric, a signal-to-noise metric, and a Received Signal Strength Indicator (RSSI) metric.

12. The system of claim 1, wherein the first transceiver device is configured to:
identify that a transmission from the second transceiver device has the first lengthening factor or the second lengthening factor; and
decode, based on the identification, the identified transmission.

13. A method for wireless communication in an electric vehicle, the method comprising:

electrically coupling a first wireless cell node with a first plurality of battery cells, the first wireless cell node including a first transceiver device;

wirelessly communicating between the first transceiver device and a second transceiver device, wherein a battery management system controller subsystem includes a network manager, and wherein the network manager includes the second transceiver device; and determining that a noisy environment is present and, in response, switching the first transceiver device and the second transceiver device from a normal operating mode to a noise immunity operating mode, wherein the normal operating mode has a first lengthening factor with a first number of transmitted bits per bit of information, and wherein the noise immunity operating mode has a second lengthening factor with a second number of transmitted bits per bit of information that is greater than the first number of transmitted bits per bit of information.

14. The method of claim 13, wherein the second lengthening factor is equal to or greater than 2 times the first lengthening factor.

15. The method of claim 13, wherein determining that a noisy environment is present includes:

determining that the noisy environment is present using one or more of a packet delivery ratio metric, an inter packet delay metric, a signal-to-noise metric, and a Received Signal Strength Indicator (RSSI) metric.

16. The method of claim 13, further comprising:

transmitting, during the normal operating mode, within a first timeslot having a first duration; and transmitting, during the noise immunity operating mode, within a second timeslot having a second duration.

17. The method of claim 16, wherein the second duration is greater than the first duration.

18. The method of claim 13, further comprising:

identifying that a transmission from the second transceiver device has the first lengthening factor or the second lengthening factor; and decoding, based on the identification, the identified transmission.

19. A system for wireless communication in an electric vehicle and having a normal operating mode and a noise immunity operating mode, the system comprising:

a first wireless cell node electrically coupled with a first plurality of battery cells, the first wireless cell node including a first transceiver device;

a battery management system controller subsystem including a network manager, wherein the network manager includes a second transceiver device; and means for determining that a noisy environment is present and, in response, switching the first transceiver device and the second transceiver device from a normal operating mode to a noise immunity operating mode, wherein the normal operating mode has a first lengthening factor with a first number of transmitted bits per bit of information, and wherein the noise immunity operating mode has a second lengthening factor with a second number of transmitted bits per bit of information that is greater than the first number of transmitted bits per bit of information.

20. The system of claim 19, wherein the first transceiver device is configured to transmit, during the normal operating mode, within a first timeslot having a first duration, and wherein the first transceiver device is configured to transmit, during the noise immunity operating mode, within a second timeslot having a second duration.

* * * * *